US008149039B1

(12) United States Patent
Wang et al.

(10) Patent No.: US 8,149,039 B1
(45) Date of Patent: Apr. 3, 2012

(54) INTEGRATED PICOSECOND PULSE GENERATOR CIRCUIT

(75) Inventors: Pingshan Wang, Central, SC (US); Chaojiang Li, Clemson, SC (US)

(73) Assignee: Clemson University, Anderson, SC (US)

( * ) Notice: Subject to any disclaimer, the term of this patent is extended or adjusted under 35 U.S.C. 154(b) by 55 days.

(21) Appl. No.: 12/570,349

(22) Filed: Sep. 30, 2009

Related U.S. Application Data (60) Provisional application No. 61/101,301, filed on Sep. 30, 2008.

(51) Int. Cl.
*H03K 3/00* (2006.01)
(52) U.S. Cl. .......................... 327/291; 327/164
(58) Field of Classification Search .................. 327/291, 327/164
See application file for complete search history.

(56) References Cited

U.S. PATENT DOCUMENTS

| 5,412,254 | A | * | 5/1995 | Robinson et al. | 307/106 |
| 5,444,308 | A | * | 8/1995 | O'Loughlin | 307/106 |
| 5,656,873 | A | * | 8/1997 | O'Loughlin et al. | 307/106 |
| 5,818,266 | A | * | 10/1998 | Park | 327/55 |
| 6,278,239 | B1 | * | 8/2001 | Caporaso et al. | 315/5.41 |

OTHER PUBLICATIONS

Article—*A Wide Band T/R Switch Using Enhanced Compact Waffle Mosfets*, Wen Wu, et al., IEEE Microwave and Wireless Components Letters, vol. 16, No. 5, May 2006, pp. 287-289.
Article—*Active and Nonlinear Wave Propagation Devices in Ultrafast Electronics and Optoelectronics*, Mark Rodwell, et al., Proceedings of the IEEE, vol. 82, No. 7, Jul. 1994, pp. 1037-1059.
Article—*Efficient Transient Compression Using all-Silicon Nonlinear Transmission Line*, M. Birk, at al., IEEE Microwave and Guided Wave Letters, vol. 8, No. 5, May 1998, pp. 196-198.
Article—A Novel Silicon Schottky Diode for NLTL Applications, Falah Mohammed, et al., IEEE Transactions of Electron Devices, vol. 52, No. 7, Jul. 2005, pp. 1384-1391.
Article—3.3 ps electrical pulse generation from a discharge-based metal-semiconductor-metal photodetector, K. Takahata, et al., Electronics Letters, Jan. 6, 2005, vol. 41, No. 1.
Article—A Review of Short Pulse Generator Technology, John Mankowski, et al., IEEE Transactions of Plasma Science, vol. 28, No. 1, Feb. 2000, pp. 102-108.
On the Development of a Compact Sub-Nanosecond Tunable Monocycle Pulse Transmitter for UWB Applications, Jeongwoo Han, et al., IEEE Transactions of Microwave Theory and Techniques, vol. 54, No. 1, Jan. 2006, pp. 285-293.
Picosecond Pulse Formation by Transmission Line Discontinuities, M.Y. Frankel, et al., Electronics Letters, Sep. 28, 1989, vol. 25, No. 20., pp. 1363-1365.

* cited by examiner

*Primary Examiner* — Ryan Jager
(74) *Attorney, Agent, or Firm* — Dority & Manning, P.A.

(57) ABSTRACT

A picosecond pulse generator apparatus and methodology is disclosed. A pulse generator is provided by forming a transmission line and a switching element on a common semiconductor substrate or semiconductor chip. The transmission line and the switching element can be provided on the common CMOS semiconductor substrate using standard CMOS technology. A voltage is applied to the transmission line to charge the transmission line. An input pulse is applied to the switching device to trigger the switching device to cause the transmission line to discharge an output pulse across a load resistor. The pulse width of the output pulse depends in major part on the length of the transmission line. Additional components can be provided on the common semiconductor substrate or chip to shape the input pulse to the switching device to ensure a fast rise time.

7 Claims, 6 Drawing Sheets

INTEGRATED PICOSECOND PULSE GENERATOR CIRCUIT

PRIORITY CLAIM

This application claims priority to U.S. Provisional Application No. 61/101,301 filed on Sep. 30, 2008 which is hereby incorporated by reference for all purposes.

STATEMENT OF GOVERNMENT INTEREST

The United States Government may have rights in this invention pursuant to Grant No. FA 9550-06-1-0505 between Clemson University and the United States Air Force Research Office.

FIELD OF THE INVENTION

The present subject matter relates to electrical pulse generator circuits. More particularly, the present subject matter relates to an on-chip picosecond electrical pulse generator that can be implemented using complementary metal-oxide-semiconductor (CMOS) technology.

BACKGROUND OF THE INVENTION

Picosecond electrical pulses have many applications, including clocks for high-speed analog-to-digital converters (ADC) and high-speed circuit component characterization using time-domain-reflectometry (TDR).

Known approaches to generating picosecond electrical pulses include: nonlinear transmission lines (NLTL) as described by, for instance, Rodwell et al. in "Active and nonlinear wave propagation devices in ultrafast electronics and optoelectronics," *Proc. IEEE, vol.* 82, no. 7, pp. 1037-1059, 1994 and by Birk et al. in "Efficient transient compression using an all-silicon nonlinear transmission line," *IEEE Microwave and Guided Wave Letters*, vol. 8, no. 5, pp. 196-198, 1998. Other approaches include transmission line discontinuities as described by, for instance, Frankel et al. in "Picosecond pulse formation by transmission line discontinuity," *Electronic Letters, vol.* 25, no. 20, pp. 1363-1364, 1989[5]; and photoconductive switching as described by, for instance, Takakata et al. in "3.3 ps electrical pulse generation from a discharge-based metal semiconductor-metal photodetector," *Electronics Letters*, vol. 41, no. 1, pp. 38-39, 2005.

These methods exploit the electromagnetic properties of passive circuit components to produce fast signals. It can be difficult to implement these circuits using CMOS technologies on a CMOS semiconductor substrate even though all-silicon NLTLs to sharpen the signal rise edges to 8-ps have been reported by Mohammed et al. in "A novel silicon schottky diode for NLTL applications," *IEEE Transactions on Electronic Devices*, vol. 52, no. 7, pp. 1384-1391, 2005.

Digital circuits can be used to generate short-pulses, but the pulse widths of the output pulses are determined by the speed of the transistors used in the digital circuits. A bench-mark for pulse-duration of the generated pulses is the fan-out-of-four (FO4) propagation delay of corresponding inverter gates. An exemplary FO4 delay corresponds to about 50 ps for the present technology.

Nanosecond and sub-nanosecond electrical pulses have been generated through a few other techniques, such as those circuits for ultrawide-band (UWB) applications disclosed in, for example, J. Han et al, "On the development of a compact sub-nanosecond tunable monocycle pulse transmitter for UWB applications," *IEEE Transactions on Microwave Theory and Techniques*, pp. 1-9, 2006, and various pulsed-power circuit topologies. These techniques also exploit the properties of transmission lines. However, on-chip applications of these techniques and their picosecond pulse generation capabilities have not previously been reported.

All of the foregoing publications are hereby incorporated by reference for all purposes.

There is a need for a picosecond pulse generator circuit that can be implemented on a common semiconductor substrate, such as a CMOS semiconductor substrate. While various implementations of picosecond pulse generation circuits and systems have been developed, no design has emerged that generally encompasses all of the desired characteristics as hereafter presented in accordance with the subject technology.

SUMMARY OF THE INVENTION

Aspects and advantages of the invention will be set forth in part in the following description, or may be obvious from the description, or may be learned through practice of the invention.

One exemplary embodiment of the present disclosure is directed to a pulse generator circuit that includes a transmission line configured to be charged when voltage is applied to the transmission line. The pulse generator circuit further includes a switching device operably connected to the transmission line and a trigger circuit operably connected to the switching device. The trigger circuit is configured to provide an input pulse to the switching device. The transmission line discharges an output pulse when the trigger circuit provides an input pulse to the switching device. The pulse width of the output pulse depends in major part on the length of the transmission line. The amplitude of the output pulse depends in major part on the charging voltage applied to the transmission line. The pulse generator according to exemplary embodiments of the present technology can therefore transform the input pulse provided by the trigger circuit into an output pulse having a desired pulse width, such as a pulse width in the range of about 6.0 to about 10.0 picoseconds, and amplitude by varying transmission line length and charging voltage. The transmission line, the switching device, and the trigger circuit are located on a common semiconductor substrate. For example, the transmission line, the switching device, and the trigger circuit can be provided on a common complementary metal-oxide-semiconductor (CMOS) substrate.

Various additions or modifications can be made to this exemplary embodiment of the disclosure.

Another exemplary embodiment of the present disclosure is directed to a pulse generator circuit having a voltage source, a load resistor and a transmission line operably connected between the voltage source and the load resistor. The transmission line has a length and a characteristic impedance. The pulse generator circuit further includes an N-type field effect transistor having a gate terminal, a drain terminal, and a source terminal. The N-type field effect transistor can also have a bulk terminal that is connected to ground or to a reference voltage. The drain terminal of the N-type field effect transistor is coupled to the transmission line. The pulse generator circuit further includes a trigger circuit coupled to the gate terminal of the N-type field effect transistor. The trigger circuit provides an input pulse to the gate terminal and the N-type field effect transistor is driven into a linear regime when the input signal is provided to the gate terminal. The transmission line discharges an output pulse across the load resistor when the N-type field effect transistor operates in the linear regime. The transmission line, the switching device, and the trigger circuit can all be located on a common semiconductor chip, such as a common CMOS semiconductor chip.

In a variation of this exemplary embodiment, the trigger circuit can be configured to convert an input signal provided by an input signal generator into an input pulse having a desired fast rise time. For instance, the input signal can have a rise edge of about 50.0 picoseconds and the input pulse can have a rise edge in the range of about 20.0 picoseconds to about 30.0 picoseconds. The input signal generator can be, for instance, a ring oscillator or other suitable signal generator. In a particular embodiment, the trigger circuit can comprises an inverter chain. In another particular embodiment, the trigger circuit can comprise a Schmidt trigger circuit.

In yet another variation of this exemplary embodiment, the N-type field effect transistor can have an equivalent resistance when the N-type field effect transistor operates in the linear regime. The equivalent resistance of the N-type field effect transistor in series with the resistance of the load resistor can be substantially equal to the characteristic impedance of the transmission line for matching purposes.

A further exemplary embodiment of the present disclosure is directed to a method for generating an output pulse. The method includes providing a transmission line, a switching element and a trigger circuit on a common semiconductor substrate; charging the transmission line with a source voltage; providing an input pulse to the switching device from the trigger circuit to close the switching device; and discharging an output pulse from the transmission line across a load resistor when the switching device is closed.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best regime thereof, directed to one of ordinary skill in the art, is set forth in the specification, which makes reference to the appended figures, in which:

FIGS. 6 and 7 graphically illustrate simulation results wherein

DETAILED DESCRIPTION OF THE DRAWINGS

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention covers such modifications and variations as come within the scope of the appended claims and their equivalents.

Generally, the present disclosure is directed to a picosecond pulse generator circuit that utilizes a transmission line in combination with a switching element. The transmission line and the switching element are provided on a common semiconductor substrate or semiconductor chip, such as a common CMOS semiconductor substrate. A voltage is applied to the transmission line to charge the transmission line. An input pulse is applied to the switching device to trigger the switching device to cause the transmission line to discharge an output pulse across a load resistor. The pulse width of the output pulse depends in major part on the length of the transmission line. The amplitude of the output pulse depends in part on the charging voltage applied to the transmission line. Additional components can be provided on the common semiconductor substrate or chip to shape the input pulse to the switching device to ensure a fast rise time.

Figure 1:
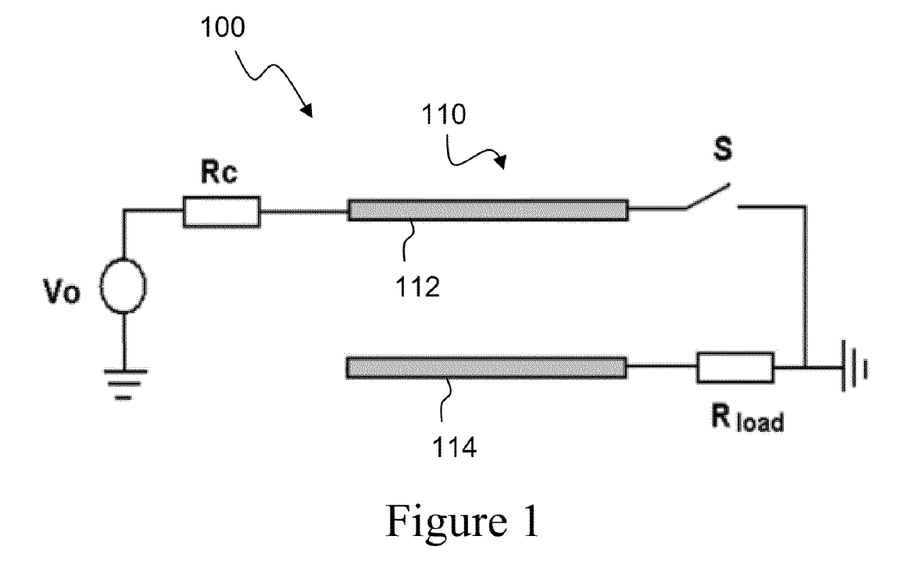
FIG. 1 depicts a conceptual diagram of an exemplary pulse generation circuit according to one exemplary embodiment of the present disclosure.

Referring now to FIG. 1, an exemplary picosecond pulse generator circuit 100 will now be disclosed. As illustrated, exemplary picosecond pulse generator circuit 100 includes a transmission line 110 having a signal line 112 and a ground line 114. A DC voltage source Vo is connected through charging resistor Rc to a source side of signal line 112 of transmission line 110. A switching device S is connected to the load side of signal line 112. A load resistor $R_{load}$ is connected to load side of ground line 114. The ground reference is connected between switching device S and $R_{load}$. The source side of ground line 114 is left floating.

DC voltage Vo is applied to transmission line 110 to charge transmission line. When switching device S is closed, transmission line discharges an output pulse across load resistor $R_{load}$. The duration of the output pulse is Vo/2 with a duration time of 2 d/v, where d is the length of transmission line 110 and v is the wave propagation velocity which can be calculated by $$v = \frac{c}{\sqrt{\varepsilon_r}}$$

where c is the speed of light and s, is the relative permittivity of the dielectric material which insulates the transmission line 110.

Figure 2:
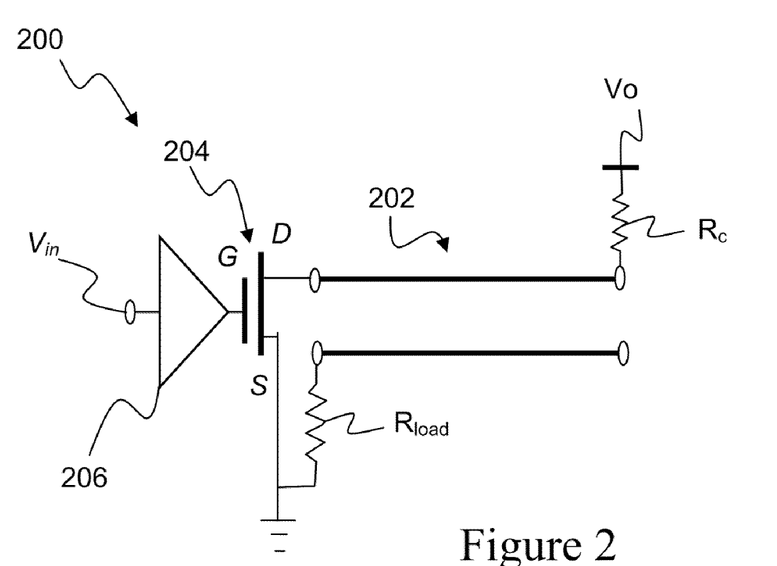
FIG. 2 depicts an exemplary pulse generation circuit according to one exemplary embodiment of the present disclosure.

FIG. 2 depicts an exemplary picosecond pulse generator circuit 200, similar to the picosecond pulse generator circuit 100 illustrated in FIG. 1, that can be implemented on a semiconductor substrate, such as common CMOS semiconductor substrate using standard CMOS techniques. Pulse generator circuit 200 comprises an on-chip CMOS transmission line 202 and an N-type field effect transistor (NFET) 204. NFET 204 corresponds to switching device S of FIG. 1. When trigger circuit 206 provides an input pulse to the gate terminal of NFET 204, NFET 204 operates in a linear regime allowing transmission line 202 to discharge an output pulse across load resistor $R_{load}$. Pulse generator circuit 200 resembles the basic pulse-forming-line techniques in traditional pulsed-power technologies as described, for example by Mankowski at al. in "A review of short pulse generator technology," *IEEE Transactions on Plasma Science*, vol. 28, no. 1, pp. 102-108, 2000, which is incorporated herein by reference for all purposes. Pulse generator circuit 200 differs in at least that the NFET 204 is well under control and the source terminal S of NFET 204 is grounded to improve switching performance.

Figure 3:
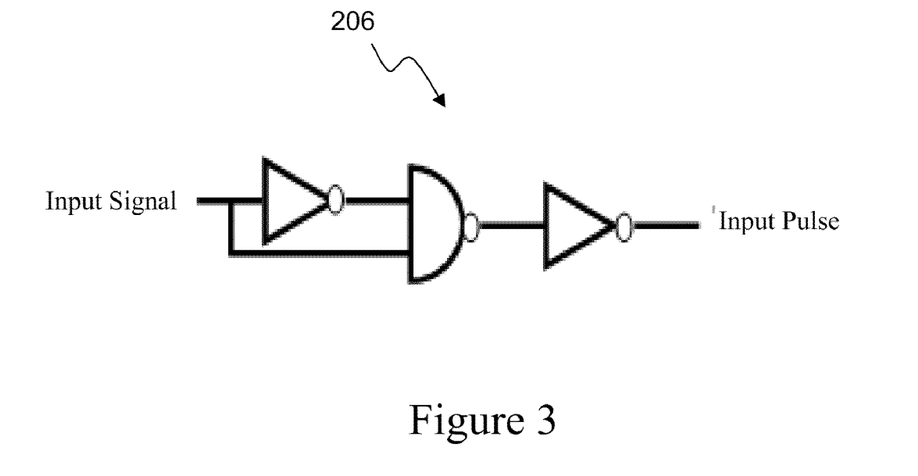
FIG. 3 depicts an exemplary trigger circuit according to one exemplary embodiment of the present disclosure.

The switching speed of NFET 204 is significant to the present subject matter. In particular, the input pulse used to trigger NFET 204 preferably includes a fast rising edge. To attain such an input pulse with a fast rising edge, a trigger circuit 206 is used to shape an input signal into an input pulse have a fast rising edge. For instance, in one exemplary embodiment, a fast rising edge of an input pulse can be accomplished with Schmitt trigger 206 as illustrated in FIG. 2. In an alternative exemplary configuration, inverter chains as illustrated in FIG. 3, with adjusted threshold voltages, can be employed for this purpose. The obtained rise-time when using a Schmitt trigger 206 of FIG. 2, however, can be much shorter than the propagation delay of inverters in a ring oscillator since there are no P-type field effect transistors (P-FET) to complicate the process. Furthermore, the falling edge of the obtained trigger signal is not critical to the present subject matter, which simplifies the circuit design.

Figure 4:
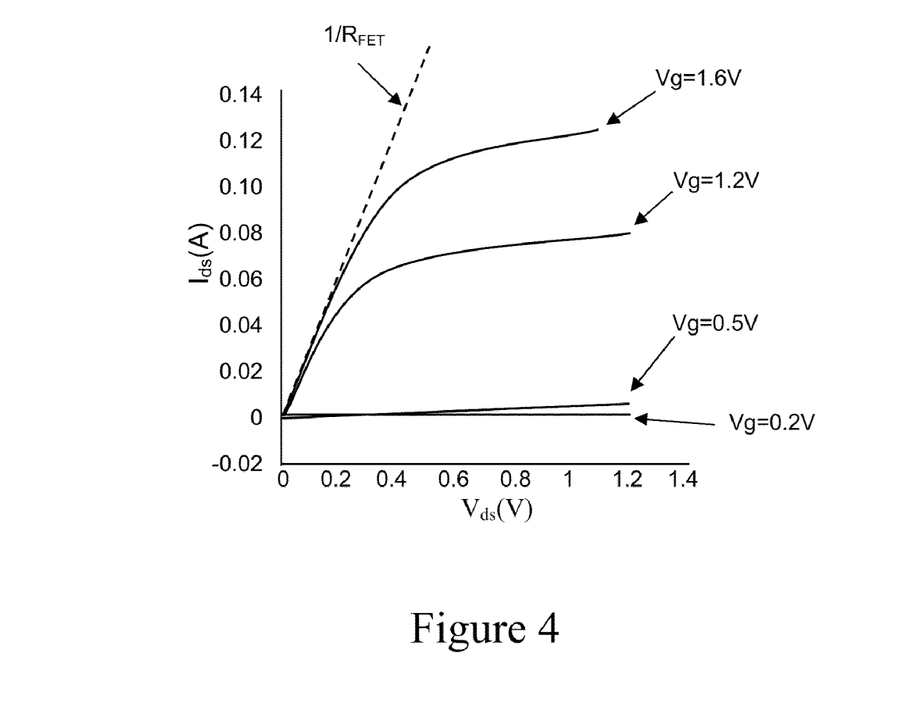
FIG. 4 graphically represents $I_{ds}$-$V_{ds}$ characteristics of an exemplary NFET device usable with the circuit of FIG. 2.

When operated in the linear regime, NFET 204 is equivalent to a resistor. Linear regime operation is illustrated in FIG. 4 by dashed line $1/R_{FET}$ for an exemplary NFET device as may be employed with exemplary embodiments of the present disclosure. The equivalent resistance of NFET 204 and load resistor $R_{load}$ should be equal to the characteristic impedance of the transmission line to satisfy matching conditions. As a result, the voltage drop across the equivalent resistance of NFET 204 is about half of the charging voltage Vo applied to transmission line 202 by way of charging resistor Rc.

The duration of the output pulse for the exemplary picosecond generator circuit depicted in FIG. 2 is about 2 d/v, where d is the transmission line length and v is the signal transmission velocity on the transmission line. Under these operating criteria, the amplitude and duration of the output pulse are primarily determined by the charging voltage applied to the transmission line and the transmission line length, respectively.

Figure 5:
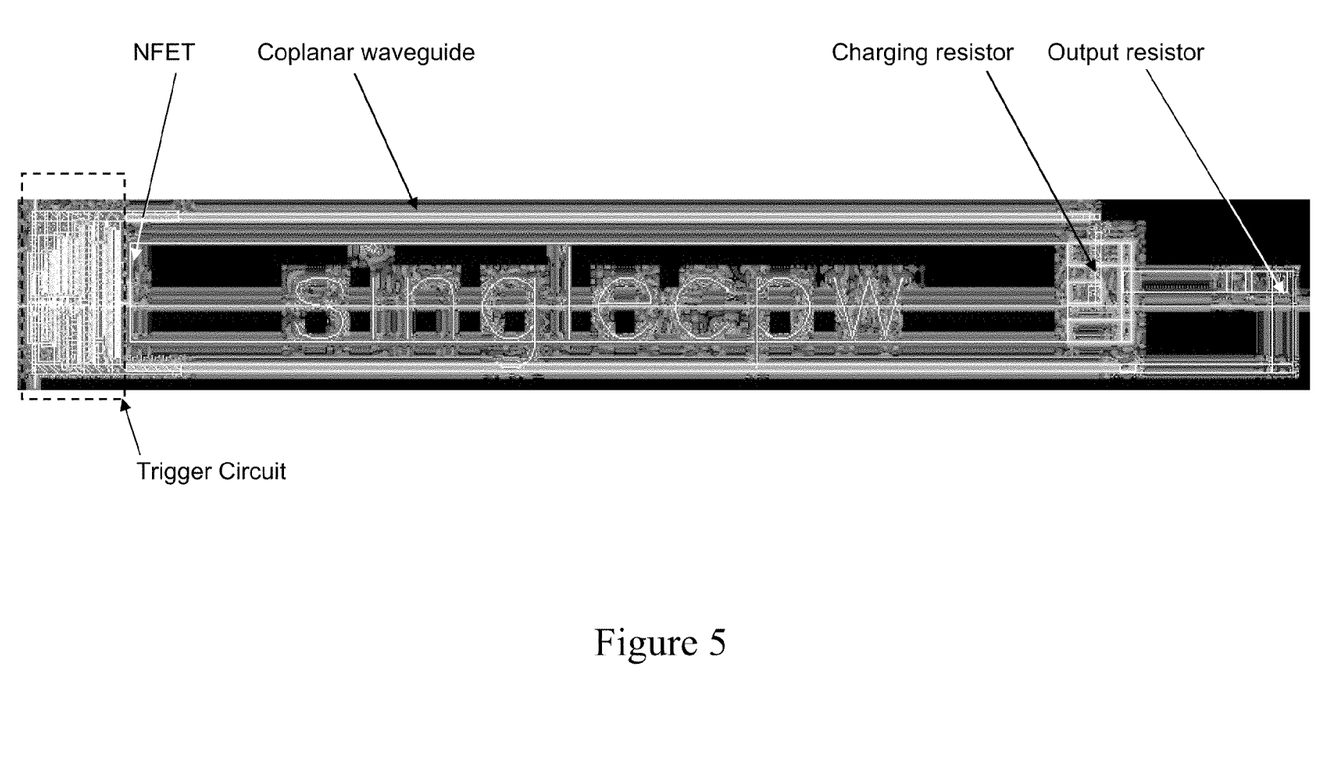
FIG. 5 illustrates an exemplary layout of the picosecond pulse generating circuit using IBM CMOS technology.

With reference now to FIG. 5, there is illustrated an exemplary layout of a picosecond pulse generator on a common CMOS semiconductor substrate in accordance with an exemplary embodiment of the present disclosure using standard IBM 0.13 µm CMOS technology to implement the pulse generator circuit. In the exemplary configuration of FIG. 5, the on-chip CMOS transmission line or coplanar waveguide is about 500 µm long. The trigger circuit and the NFET are standard CMOS devices as will be readily appreciated by those of ordinary skill in the art.

Figure 6:
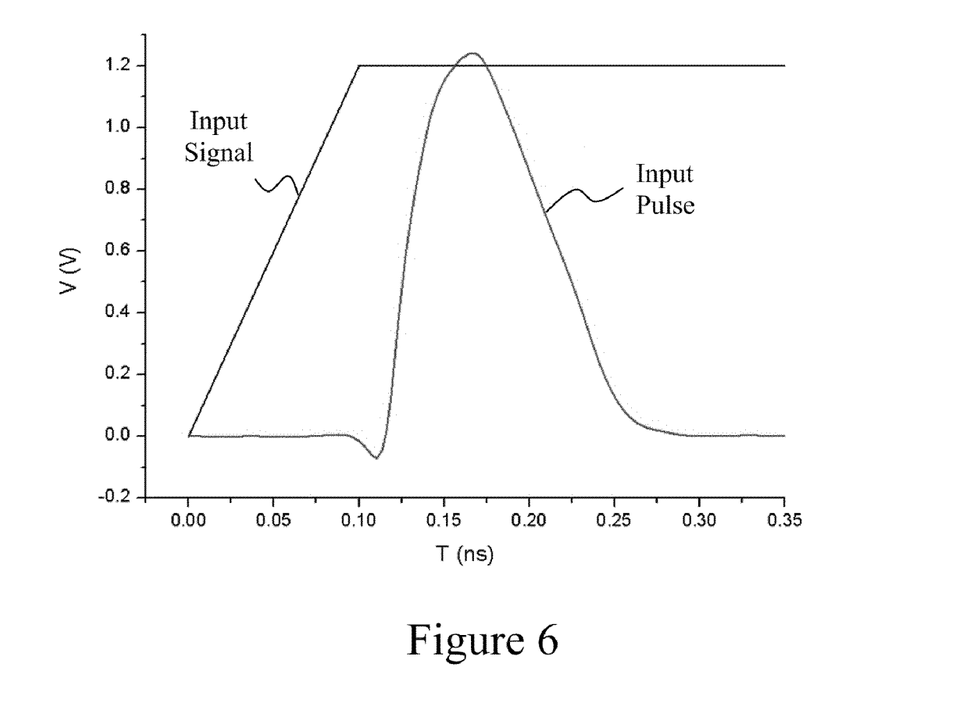
FIG. 6 represents input signals and FIG. 7 represents output signals.
Figure 7:
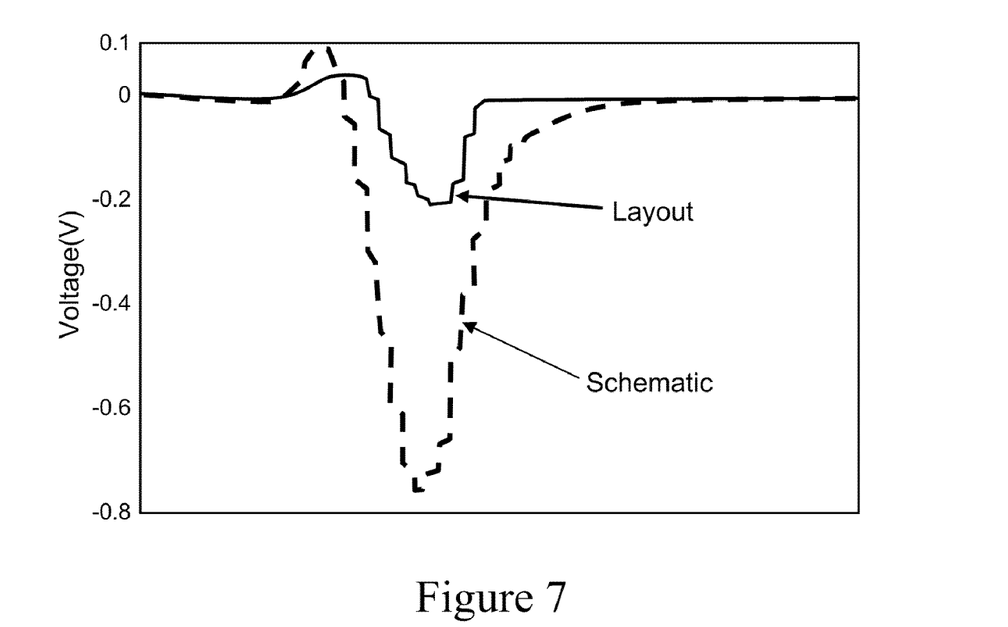

With reference to FIGS. 6 and 7, there are illustrated exemplary waveforms obtained from post layout simulation of the present technology wherein FIG. 6 represents input signals and FIG. 7 represents output signals. The input signal, illustrated as $V_{in}$ in FIG. 2, and noted as Input Signal in FIG. 7 has a 50 ps rise edge. Such input pulses can be easily obtained on chip, for instance by use of ring oscillators. The input signal is then converted to a pulse by trigger circuit 206 with about a 20 ps rise edge to drive the NFET 204 of FIG. 2. NFET 204 is driven into linear operation regime and effectively becomes a small valued resistor, which is connected in series with load resistor $R_{load}$.

From experimental observation it was determined that the obtained pulse had a full-width-half-magnitude (FWHM) of about 6 ps, which is close to the expected duration as determined by the 500 µm long line length and the signal velocity of $1.6 \times 10^{11}$ mm/s. Further, experimental observation showed that the obtained pulse width was significantly shorter than the 50 ps FO4 for the technology used. It was also observed that the 10%-10% pulse width was about 8.6 ps.

When the transmission line length is reduced to 100 µm, the FWHM is not significantly reduced. The additional pulse duration is mainly caused by the relatively large parasitic capacitance of NFET 204 and the obtained pulse resembles that of an RC discharge circuit. Ideally, the obtained pulse amplitude should be Vo/2 or about 800 mV. Schematic simulation gives about 720 mV as illustrated in FIG. 7. The layout simulation, however, yields about 217 mV. The significant signal amplitude difference is believed to be attributable to the deterioration of the trigger pulse rising edge in the layout as is shown in FIG. 6, where parasitic effects are severe for the simple layout used.

A more compact layout, such as Waffle layout as described by Wu et al. in "A wide-band T/R switch using enhanced compact waffle MOSFETs," *IEEE Microwave and Wireless Components Letters*, vol. 16, no. 5, pp. 287-289, 2006, which is hereby incorporated by reference for all purposes, can be employed to improve the performance. The repetition rate of the output pulse is mainly determined by the charging time of the transmission lines. For the circuit in FIG. 2, the repetition rate is higher than 400 MHz.

Using the disclosures provided herein, those of ordinary skill in the art should appreciate that a variety of different configurations of transmission lines and switching elements can be used to provide an picosecond pulse generator without deviating from the scope of the present invention. The transmission lines and switching devices can all be implemented on a common semiconductor substrate, such as a CMOS semiconductor substrate using CMOS technologies similar to the exemplary pulse generator circuit discussed in FIG. 2. Representative exemplary circuit configurations will now be discussed in detail with reference to FIGS. 8-12.

Figure 8:
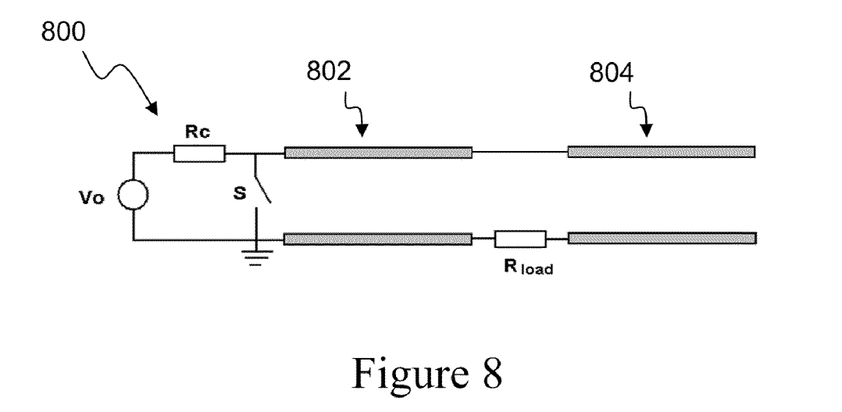
FIGS. 8-11 depict various exemplary pulse generation circuits according to exemplary embodiments of the present disclosure.

FIG. 8 depicts pulse generator circuit 800. Pulse generator circuit 800 includes two identical transmission lines 802 and 804 connected in series with a load resistor $R_{load}$. The load resistor $R_{load}$ is connected between the two ground lines of transmission lines 802 and 804. The output pulse amplitude is −Vo. The pulse duration is 2 d/v where d is the transmission line length and v is the signal transmission velocity on the transmission line.

Figure 9:
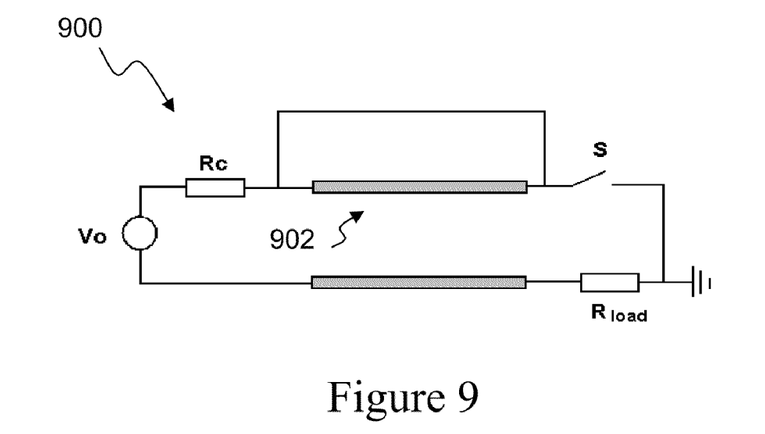

FIG. 9 depicts pulse generator circuit 900. In pulse generator circuit 900, the output end of transmission line 902 is connected to the input end of transmission line 902. When the switch is on, the discharging process of transmission line 902 starts simultaneously from both ends of transmission line 902. The output pulse amplitude is Vo/2 and the pulse duration is d/v where d is the transmission line length and v is the signal transmission velocity on the transmission line. This pulse duration is half of pulse generator circuit 200 depicted in FIG. 2.

Figure 10:
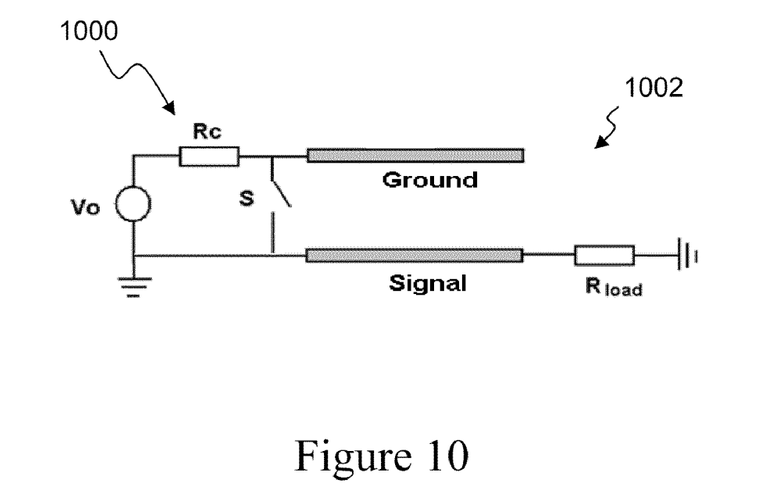

FIG. 10 depicts pulse generator circuit 1000. Pulse generator circuit 1000 can be used to generate a bi-directional output pulse across $R_{load}$ in which the polarity of the pulse changes in the middle of the pulse. The output pulse amplitude is ±Vo/2 and the pulse duration is d/v where d is the transmission line length and v is the signal transmission velocity on the transmission line. This pulse duration is half of pulse generator circuit 200 depicted in FIG. 2.

Figure 11:
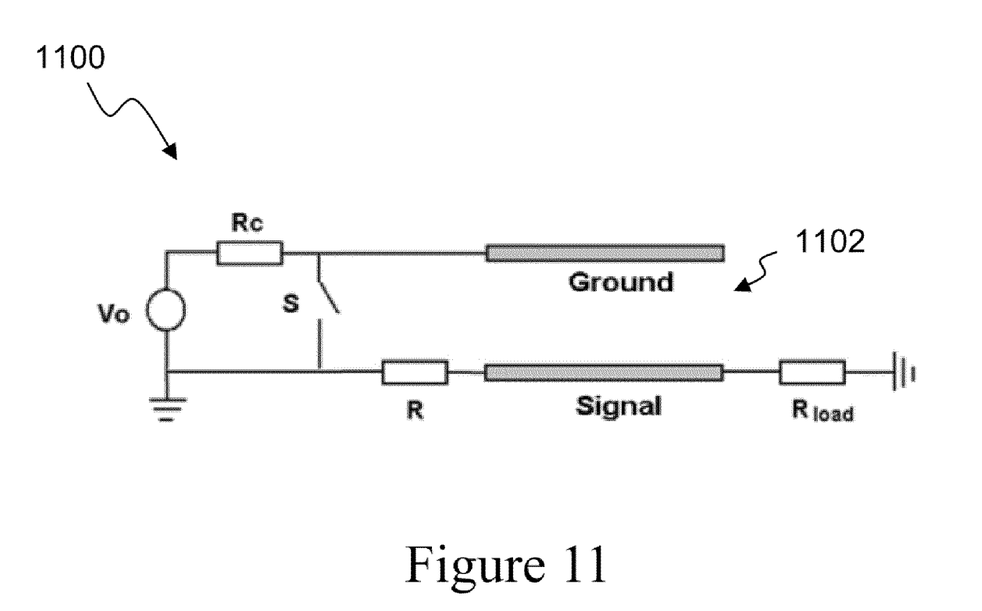

FIG. 11 depicts pulse generator circuit 1100. Pulse generator circuit 1100 is similar to pulse generator circuit 1000 of FIG. 10 but adds another matched resistor R at the input end of transmission line 1102. The wave that propagates to the switch S direction will be absorbed by matched resistor R instead of shorted to ground. The output pulse amplitude is Vo/2 and the pulse duration is d/v where d is the transmission line length and v is the signal transmission velocity on the transmission line. This pulse duration is half of pulse generator circuit 200 depicted in FIG. 2.

Each of the above pulse generator circuits can be implemented on a CMOS semiconductor substrate using CMOS techniques as discussed above with respect to pulse generator circuit 200 illustrated in FIG. 2. For instance, the transmission lines can be CMOS transmission lines, the switching devices can be NFET transistors and the trigger circuits can be Schmidt triggers or inverter chains. Each of the above circuits can be provided on a common semiconductor substrate or chip using standard CMOS technology.

Table 1 provided below provides a shortest pulse comparison of simulation results for both schematic and post layout simulations for circuits 100, 800, 900, 1000, and 1100 discussed above.

TABLE 1

| | | | Simulation in Cadence | | |
|---|---|---|---|---|---|
| | Theoretical | | Schematic | | Post-Layout |
| Circuit | Pulse Duration | Output Voltage | Pulse Duration (ps) | Output Voltage (V) | Pulse Duration (ps) | Output Voltage (V) |
| 100 | 2d/v | −Vo/2 | 7 | −0.38 | 8 | −0.34 |
| 800 | 2d/v | −Vo | 6 | −0.17 | 10 | −0.24 |
| 900 | d/v | −Vo/2 | 6 | 0.37 | 7 | 0.11 |
| 1000 | d/v | ±Vo/2 | 5 | −0.2/0.17 | 8 | −0.37/0.27 |
| 1100 | d/v | −Vo/2 | 6 | −0.08 | 7 | −0.11 |

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A pulse generator circuit, comprising:
   a voltage source;
   a load;
   a transmission line operably connected between said voltage source and said load, said transmission line have a length and a characteristic impedance;
   an N-type field effect transistor having a gate terminal, a drain terminal, and a source terminal, said drain terminal of said N-type field effect transistor being operably connected to said transmission line and said source terminal of said N-type field effect transistor being directly connected to ground; and
   a trigger circuit operably connected to said gate terminal of said N-type field effect transistor, said trigger circuit providing an input pulse to said gate terminal, said N-type field effect transistor being driven to a linear regime when said input pulse is provided to said gate terminal, said transmission line discharging an output pulse across said load resistor when said N-type field effect transistor operates in the linear regime; said output pulse having a full-width-half-magnitude pulse width in the range of about 6.0 picoseconds to about 10.0 picoseconds;
   wherein said transmission line, said N-type field effect transistor, and said trigger circuit are located on a common semiconductor substrate.

2. The pulse generator circuit of claim 1, wherein said length of said transmission line is in the range of about 100 µm to about 500 µm.

3. The pulse generator circuit of claim 1, wherein said trigger circuit comprises an inverter chain.

4. The pulse generator circuit of claim 1, wherein said trigger circuit comprises a Schmitt trigger circuit.

5. The pulse generator circuit of claim 1, wherein said pulse generator circuit further comprises an input signal generator for providing an input signal to said trigger circuit, said trigger circuit converting said input signal into said input pulse.

6. The pulse generator of claim 5, wherein said input signal has a rise edge in the range of about 50.0 to about 70.0 picoseconds and said input pulse has a rise edge of about 20.0 picoseconds to about 30.0 picoseconds.

7. The pulse generator of claim 1, wherein said N-type field effect transistor has an equivalent resistance when said N-type field effect transistor operates in the linear regime, said equivalent resistance of said N-type field effect transistor in series with said resistance of said load resistor being substantially equal to said characteristic impedance of said transmission line.

* * * * *